(12) United States Patent
Kim et al.

(10) Patent No.: US 8,809,084 B2
(45) Date of Patent: Aug. 19, 2014

(54) LASER INDUCED THERMAL IMAGING METHOD AND A METHOD OF FABRICATING ORGANIC LIGHT EMITTING DISPLAY

(75) Inventors: Mu-Hyun Kim, Suwon-si (KR); Byung-Doo Chin, Seongnam-si (KR); Myung-Won Song, Suwon-si (KR); Seong-Taek Lee, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 1995 days.

(21) Appl. No.: 11/020,672

(22) Filed: Dec. 27, 2004

(65) Prior Publication Data

US 2006/0046333 A1    Mar. 2, 2006

(30) Foreign Application Priority Data

Aug. 30, 2004    (KR) .................. 10-2004-0068769

(51) Int. Cl.
| | | |
|---|---|---|
| *H01L 21/00* | (2006.01) | |
| *B41M 5/382* | (2006.01) | |
| *H01L 51/00* | (2006.01) | |
| *B41M 7/00* | (2006.01) | |
| *H01L 51/56* | (2006.01) | |
| *H01L 27/32* | (2006.01) | |

(52) U.S. Cl.
CPC ....... *H01L 51/0013* (2013.01); *B41M 5/38207* (2013.01); *B41M 7/00* (2013.01); *H01L 51/56* (2013.01); *H01L 27/3244* (2013.01)
USPC ............................................. 438/29; 438/99

(58) Field of Classification Search
USPC .................... 438/22–31, 34, 35, 99
See application file for complete search history.

(56) References Cited

U.S. PATENT DOCUMENTS

| | | | |
|---|---|---|---|
| 6,485,884 B2 * | 11/2002 | Wolk et al. ................ | 430/200 |
| 6,518,700 B1 * | 2/2003 | Friend et al. ............... | 313/504 |
| 6,555,284 B1 | 4/2003 | Boroson et al. | |
| 6,566,032 B1 | 5/2003 | Boroson et al. | |
| 6,734,623 B1 * | 5/2004 | Aziz et al. ................. | 313/506 |
| 6,918,982 B2 * | 7/2005 | Afzali-Ardakani et al. .. | 156/230 |
| 7,015,638 B2 * | 3/2006 | Furugori et al. ............ | 313/503 |
| 2002/0098614 A1 | 7/2002 | Akai | |
| 2003/0094698 A1 * | 5/2003 | Jiwari et al. ................ | 257/758 |
| 2004/0206307 A1 * | 10/2004 | Boroson et al. ............. | 118/719 |
| 2004/0231582 A1 * | 11/2004 | Foise et al. ................... | 117/3 |
| 2005/0061364 A1 * | 3/2005 | Peumans et al. ............ | 136/263 |

(Continued)

FOREIGN PATENT DOCUMENTS

| | | |
|---|---|---|
| CN | 1436025 | 8/2003 |
| CN | 1458811 | 11/2003 |

(Continued)

OTHER PUBLICATIONS

Chinese Office Action dated Sep. 26, 2008.

(Continued)

*Primary Examiner* — Savitr Mulpuri
(74) *Attorney, Agent, or Firm* — H.C. Park & Associates, PLC

(57) ABSTRACT

A laser induced thermal imaging method includes preparing a donor element and a substrate; facing a transfer layer of the donor element to the substrate and then patterning the transfer layer onto the substrate; and annealing the patterned substrate.

23 Claims, 5 Drawing Sheets

(56) References Cited

U.S. PATENT DOCUMENTS

| | | | |
|---|---|---|---|
| 2005/0191776 A1* | 9/2005 | Lamansky et al. | 438/22 |
| 2005/0266186 A1* | 12/2005 | Nguyen et al. | 428/32.77 |
| 2008/0081115 A1* | 4/2008 | Yamazaki et al. | 427/294 |

FOREIGN PATENT DOCUMENTS

| | | |
|---|---|---|
| DE | 10246425 | 4/2004 |
| EP | 0883190 | 12/1998 |
| EP | 1401033 | 3/2004 |
| EP | 1321303 | 6/2006 |
| JP | 10-206625 | 8/1998 |
| JP | 2003-077658 | 3/2003 |
| JP | 2003077657 | 3/2003 |
| JP | 2003-168559 | 6/2003 |
| JP | 2004079317 | 3/2004 |
| JP | 2004193018 | 7/2004 |
| KR | 10-0330130 | 8/2002 |
| KR | 1020040054474 | 6/2004 |

OTHER PUBLICATIONS

Jun Yeob Lee et al. "Laser-Induced Thermal Imaging of Polymer Light-Emitting Materials on Poly(3,4-ethylenedioxythiophene): Silane Hole-Transport Layer," Advanced Materials, vol. 16, No. 1, Jan. 2004.

* cited by examiner

LASER INDUCED THERMAL IMAGING METHOD AND A METHOD OF FABRICATING ORGANIC LIGHT EMITTING DISPLAY

CROSS-REFERENCE TO RELATED APPLICATION

This application claims the benefit of Korean Patent Application No. 2004-68769, filed Aug. 30, 2004, the disclosure of which is hereby incorporated herein by reference in its entirety.

BACKGROUND OF THE INVENTION

1. Field of the Invention

The present invention relates to a laser induced thermal imaging method and, more particularly, to a laser induced thermal imaging method which includes controlling aerial atmosphere in a device and annealing a transfer layer. The present invention relates to a laser induced thermal imaging for manufacturing of an organic EL display device.

2. Description of the Related Art

Of flat panel display devices, an organic light emitting display ("OLED") device has a high response speed of less than 1 ms, is low in power consumption, and has no viewing angle problem due to its self-emitting characteristic, and so has an advantage as a moving image medium regardless of the size of the device. Also, the OLED can be manufactured using a simplified manufacturing process based on the existing semiconductor process technique and thus it attracts public attention.

The OLED display device is classified into a polymer type device using a wet-dry etching technique and a monomer device having a deposition technique according to its material and a process.

Of methods of patterning a polymer or monomer light emitting layer, an ink jet printing method has a disadvantage in that a material of organic layers except the light emitting layer is restricted and a structure for the ink jet printing should be formed on a substrate. Also, in case of patterning the light emitting layer using the deposition process, it has a difficulty manufacturing a large-size device due to use of a metal mask.

As an alternative technology of such a pattering method, a laser induced thermal imaging ("LITI") has been recently developed.

The LITI is a technique that a laser generated from a light source is converted to heat energy and a pattern forming material is transferred to an object substrate using the heat energy to form a pattern. For the sake of the LITI, a donor element on which a transfer layer is formed and a substrate which is a subject are required. In the LITI, a donor film covers the acceptor substrate, and the donor film and the substrate are fixed to a stage.

The transfer layer is formed of an organic layer and has a characteristic of being so sensitive to oxygen and water vapor. That is, if the organic layer is exposed to oxygen and water vapor, life span of the organic layer is lowered or light emitting efficiency and life span are lowered if the organic layer includes a light emitting layer, thereby lowering life span and light emitting efficiency of the OLED.

SUMMARY OF THE INVENTION

It is an object of the present invention to provide a laser induced thermal imaging ("LITI") method which can improve life span and light emitting efficiency of an OLED by controlling an aerial atmosphere in a device during a LITI process.

It is another object of the present invention to provide a LITI method which can improve life span and light emitting efficiency of an OLED by annealing a transferred organic layer.

A first aspect of the present invention provides a laser induced thermal imaging method, comprising: preparing a donor element and a substrate; facing a transfer layer of the donor element to the substrate and then patterning the transfer layer onto the substrate; and annealing the patterned substrate.

A second aspect of the present invention provides a laser induced thermal imaging method, comprising: preparing a donor element and a substrate; facing a transfer layer of the donor element to the substrate and then patterning the transfer layer onto the substrate; and annealing the patterned substrate at an inert gas atmosphere.

A third aspect of the present invention provides a laser induced thermal imaging method, comprising: preparing a donor element and a substrate; facing a transfer layer of the donor element to the substrate and then patterning the transfer layer onto the substrate, at an inert gas atmosphere; and annealing the patterned substrate at an inert gas atmosphere at an inert gas atmosphere.

A forth aspect of the present invention provides a method of fabricating an organic light emitting display, comprising: forming a transfer layer on a donor element; forming arrays having thin film transistors, capacitors and lines on a substrate; forming pixel electrodes contacted each of the thin film transistors; patterning the transfer layer on the substrate after laminating the donor element and the substrate; annealing the patterned transfer layer; and forming a opposite electrode on the annealed transfer layer.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
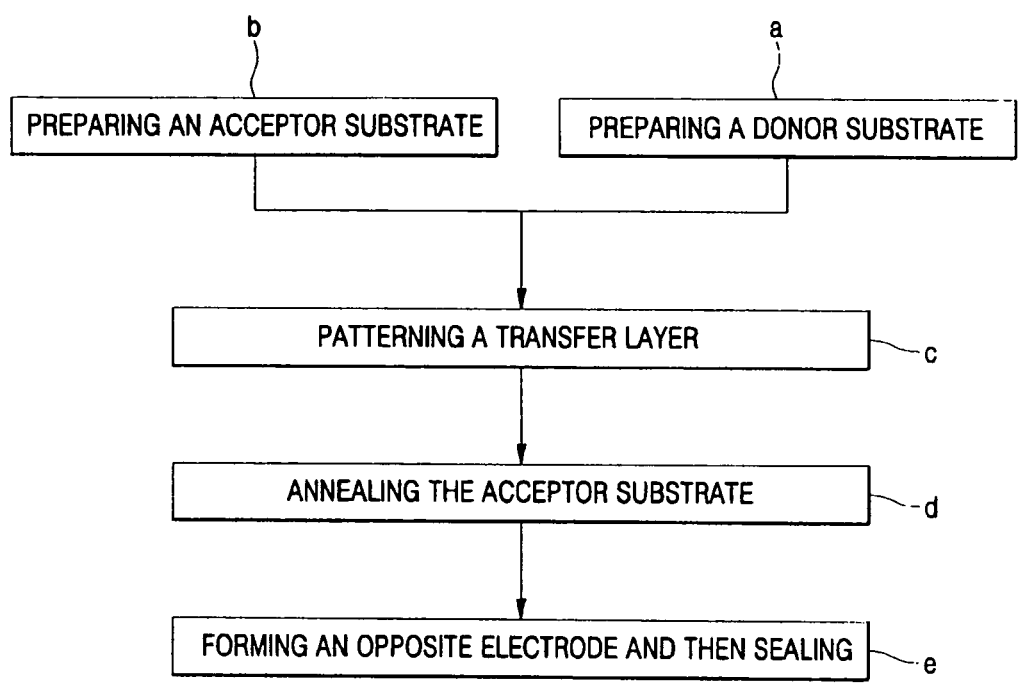
FIG. 1 is a flow chart illustrating a laser induced thermal imaging ("LITI") process according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIG. 1 is a flow chart illustrating a laser induced thermal imaging ("LITI") process according to an embodiment of the present invention.

Referring to FIG. 1, a donor element a having a transfer layer and a substrate b having a predetermined layer are prepared. The transfer layer of the donor element is located to face to the predetermined layer of the substrate, and then the transfer layer is patterned in a laser irradiating device to perform a laser induced thermal imaging process c. After the patterning, the donor element having the transfer layer is removed, and the substrate is annealed. After the annealing process, an organic layer or a counter electrode is formed on the substrate having the transfer layer and then sealed, thereby completing an OLED.

Figure 2:
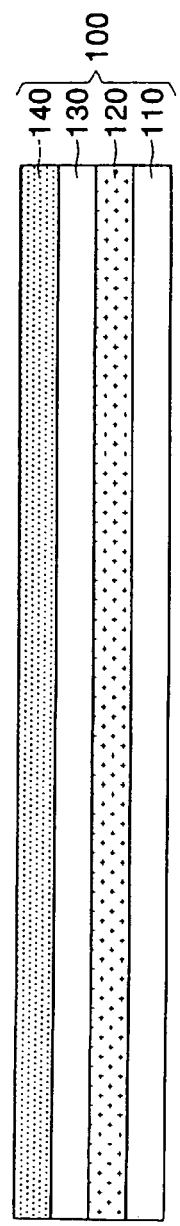
FIG. 2 is a cross-sectional view illustrating the donor element.
Figure 3:
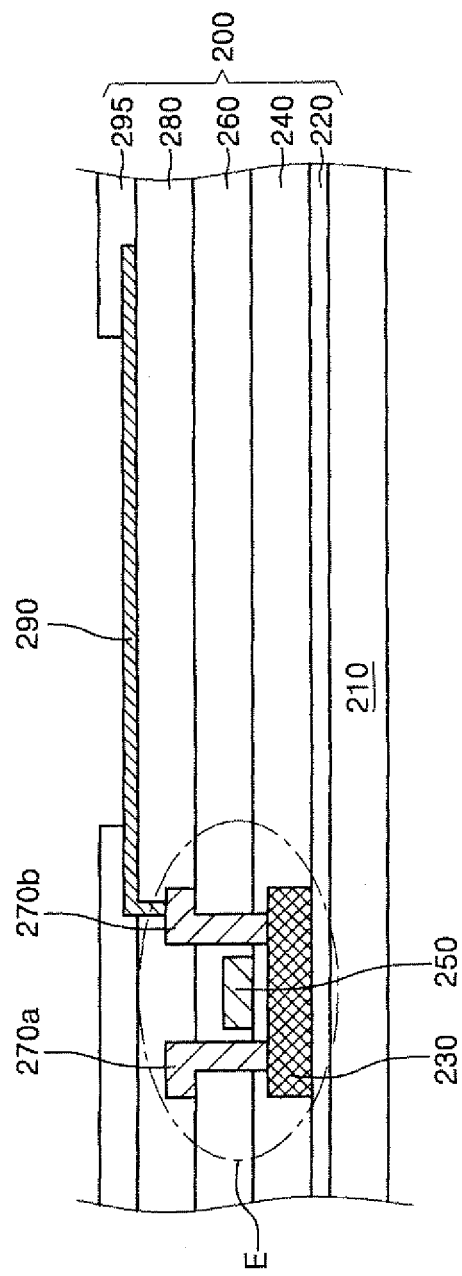
FIG. 3 is a cross-sectional view illustrating a unit pixel of the substrate having the predetermined layer formed thereon.
Figure 4:
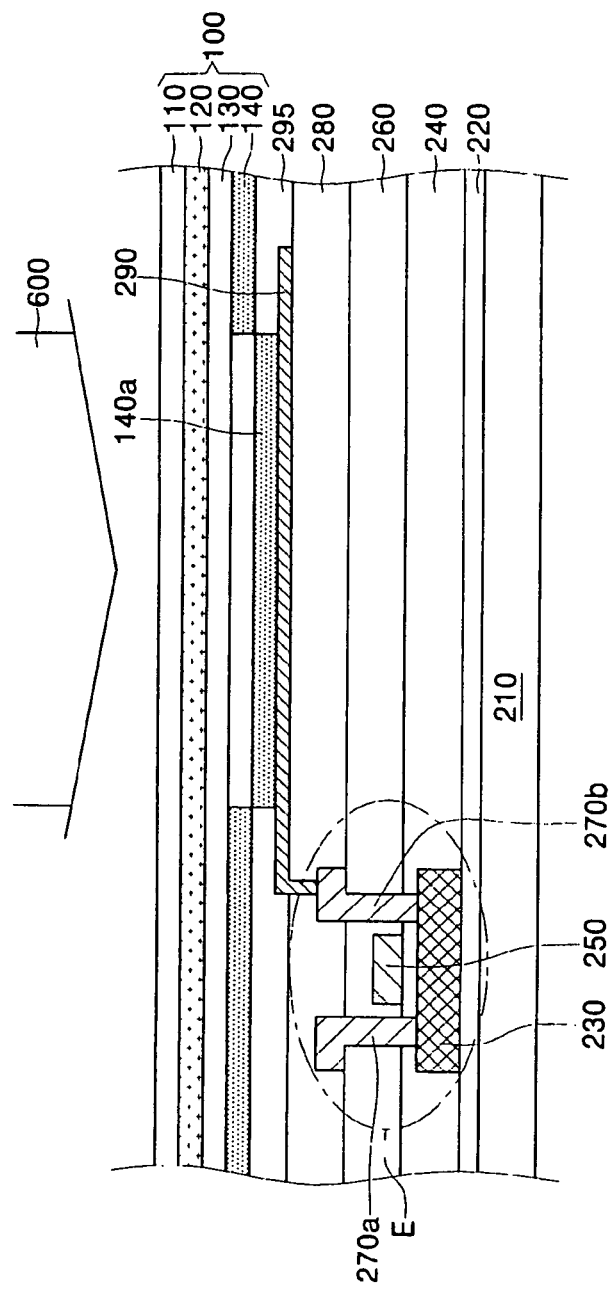
FIG. 4 is a cross-sectional view illustrating a unit pixel formed by the LITI.

FIGS. 2 to 4 are cross-sectional views illustrating respective steps of the LITI process according to the present invention.

FIG. 2 is a cross-sectional view illustrating the donor element which is labeled at "a" in FIG. 1.

Referring to FIG. 2, the donor element 100 has a structure that a plurality of layers formed on a base substrate 110. That is, the donor element includes the base substrate 110 and a light-to-heat converting layer 120 formed on the base substrate 110 and a transfer layer 140.

The base substrate 110 may be framed one and may have a flexible or hard material. If the base substrate 110 is too thin, it is difficult to handle, and if it is too thick, it may have a difficulty conveying a donor film due to its heavy weight. Preferably, a thickness of the base substrate 110 is in a range of 20 to 200 □.

The light-to-heat converting layer 120 is formed on the base substrate 110, and the transfer layer 140 is formed on the light-to-heat converting layer 120.

The light-to-heat converting layer 120 serves to convert a laser irradiated from the laser irradiating device to the heat energy, and the heat energy changes adhesive force between the transfer layer 140 and the light-to-heat converting layer 120 to thereby transfer the transfer layer 140 to the lower substrate.

To prevent damage of a transfer material and effectively control the adhesive force of the donor film, a buffer layer 130 may be interposed between the light-to-heat converting layer 120 and the transfer layer 140.

The transfer layer 140 may be a light emitting layer of the OLED. The transfer layer 140 may be one selected from a group comprised of a hole injecting layer, a hole transporting layer, a hole blocking layer, and an electron injecting layer.

The transfer layer 140 may be a monomer organic layer.

FIG. 3 is a cross-sectional view illustrating a unit pixel of the substrate having the predetermined layer formed thereon which is labeled at "b" in FIG. 1.

Referring to FIG. 3, a process of forming the predetermined layer on the substrate 210 may include forming a thin film transistor ("TFT") E having a gate electrode 250, a source electrode 270a, and a drain electrode 270b, forming a pixel electrode layer 290 connected to the TFT E, and forming a pixel defining layer 295.

In more detail, a semiconductor layer 230 is formed on the substrate 210. In order to prevent impurities existing on the substrate 210 from flowing into the semiconductor layer 230, a buffer layer 220 may be formed between the semiconductor layer 230 and the substrate 210. A gate insulating layer 240 is formed on the semiconductor layer 230, and the gate electrode 250 is formed on the gate insulating layer 240. An interlayer insulator 260 is formed on the gate electrode 250 using a typical material, and contact holes are formed to expose source and drain regions of the semiconductor layer 230. A conductive material layer is formed on the interlayer insulator 260 and patterned to form the source and drain electrodes 270a and 270b which are connected to the source and drain regions, respectively.

A planarization layer 280 is formed above the substrate 210 having the source and drain electrodes 270a and 270b, and a via hole is formed in the planarization layer 280 to expose a portion of the drain electrode 270b. An inorganic passivation layer may be formed before forming the planarization layer 280 to protect the lower layers from humidity, impurities and a wet-etching process. A conductive material layer is deposited on the planarization layer 280 having the via hole and patterned to form the pixel electrode 290. The pixel defining layer 295 is formed to expose a portion of the pixel electrode 290 to thereby define a region on which an organic layer in a unit pixel will be formed.

FIG. 4 is a cross-sectional view illustrating a unit pixel formed by the LITI which is labeled at "c" in FIG. 1.

A laser 600 is irradiated to a region to be patterned of the substrate 200 and the donor element 100.

Before performing the LITI process, the donor element 100 and the substrate 200 may be subjected to a lamination process. Due to the lamination process, the donor element 100 and the substrate 200 are fixed, and bubbles between the donor element 100 and the substrate 200 are removed by a pressurizing process for the lamination process. Therefore, it is preferred that the lamination process is performed.

After irradiating the laser 600, the adhesive force between the transfer layer 140a and the pixel electrode 290 becomes stronger than the adhesive force between the buffer layer 130 and the transfer layer 140a, and the transfer layer 140a of the region irradiated by the laser 600 is separated from the buffer layer 130 and patterned, i.e., patterned onto the pixel electrode 290. The patterned transfer layer 140a may be patterned into a stripe type or a delta type according to a type of a unit pixel.

Patterning the transfer layer onto the substrate may be performed in a vacuum state of less than $10^{-2}$ Torr. The transfer layer 140a may be a monomer organic layer.

Since the patterning is performed in a vacuum state, it is possible to prevent contamination substances which may occur on the pixel electrode and the organic layer during the patterning process, thereby increasing life span of the organic layer including the light emitting layer.

After the patterning process, the substrate 200 is removed from the donor film 100.

The transfer layer of the patterned substrate may be annealed.

The annealing process may be performed at an inert gas atmosphere.

It is preferred that the annealing process at inert gas atmosphere is performed after controlling density of water vapor to be less than 10 ppm. Also, it is preferred that the annealing process at inert gas atmosphere is performed after controlling oxygen density to be less than 50 ppm. It is because even though the device in which the annealing process is performed has an inert gas atmosphere, since it is difficult to perfectly keep out oxygen and water vapor coming in from an external portion, it is preferred to control an inflow amount of oxygen or water vapor in the device in which the annealing process is performed as described above.

As another embodiment of the present invention, regardless of atmosphere during the process of patterning the transfer layer onto the substrate, the transfer layer of the patterned substrate may be annealed at an inert gas atmosphere. The transfer layer 140a may be a monomer organic layer.

It is preferred that the annealing process at inert gas atmosphere is performed after controlling density of water vapor to be less than 10 ppm. Also, it is preferred that the annealing process at inert gas atmosphere is performed after controlling oxygen density to be less than 50 ppm.

Due to the annealing process, inert gases such as argon and nitrogen which remains on the transferred organic layer are removed. Also, by controlling a partial pressure of oxygen and water vapor during the annealing process, a characteristic of the organic layer is more improved. Therefore, life span of the organic layer is increased, and a life span characteristic of the OLED is improved.

As another embodiment of the present invention, the process of patterning the transfer layer onto the substrate may be performed at inert gas atmosphere. The transfer layer 140a may be a monomer organic layer.

It is preferred that the patterning process at inert gas atmosphere is performed after controlling density of water vapor to be less than 10 ppm. Also, it is preferred that the patterning process at inert gas atmosphere is performed after controlling oxygen density to be less than 50 ppm. Therefore, by controlling a partial pressure of oxygen and water vapor during the patterning process, the pixel electrode and the organic layer on the substrate may be protected during the patterning process, whereby life span of the organic layer including the light emitting layer is increased.

After the patterning process, the substrate 200 is removed from the donor film 100.

The substrate 200 on which the transfer layer 140a is formed may be annealed at an inert gas atmosphere.

It is preferred that the annealing process at inert gas atmosphere is performed after controlling density of water vapor to be less than 10 ppm. Also, it is preferred that the annealing process at inert gas atmosphere is performed after controlling oxygen density to be less than 50 ppm.

Due to the annealing process, inert gases such as argon and nitrogen which remains on the transferred organic layer are removed. Also, by controlling a partial pressure of oxygen and water vapor during the annealing process, a characteristic of the organic layer is more improved. Therefore, life span of the organic layer is increased, and a life span characteristic of the OLED is improved.

In all of the above described embodiments, it is preferred that the process of annealing the transfer layer of the patterned substrate at inert atmosphere to protect the transfer layer is performed in a range of temperature of less than a glass transition temperature.

A counter electrode is formed on the patterned organic layer and then sealed, thereby completing the OLED.

Figure 5:
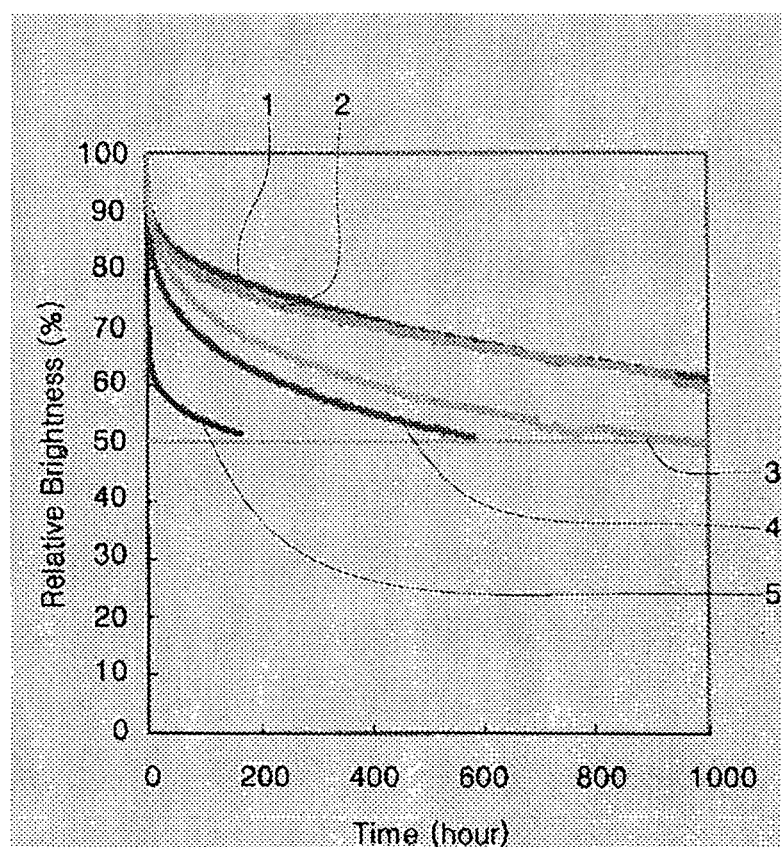
FIG. 5 is a graph illustrating a characteristic of the OLED according to the present invention.

FIG. 5 is a graph illustrating a characteristic of the OLED according to the present invention. The graph of FIG. 5 shows a variation of illumination with respect to time.

Referring to FIG. 5, "1" denotes a variation of luminance after performing the patterning process of the light emitting layer at a $N_2$ atmosphere and thereafter the annealing process, "2" denotes a variation of luminance after performing the patterning process of the light emitting layer in a vacuum state and thereafter the annealing process, and "3" denotes a variation of luminance after performing the patterning process of the light emitting layer in a normal aerial atmosphere and thereafter the annealing process. "4" and "5" denotes one which does not perform the annealing process, where "4" denotes one which patterns the light emitting layer at a normal aerial atmosphere.

It can be seen that luminance characteristic of the OLEDs which have undergone the annealing process after the patterning of the light emitting layer is such that more than 50% of an initial luminance is maintained after 1,000 hours go by regardless of the atmosphere of the patterning process. That is, it can be seen that the light emitting layer which has undergone the annealing process is more improved in life span than the light emitting layer which has not undergone the annealing process.

Performing the annealing process after the patterning process at a $N_2$ atmosphere is similar to in luminance characteristic to performing the patterning process in a vacuum state. Therefore, it can be seen that the OLED of the present invention has improved life span compared to the conventional OLED.

As described above, the laser induced thermal image can protect the pixel electrode and the transferred organic layer from gases flowing into an inside of the device from an external portion by performing the patterning process in a vacuum state, and can also improve life span of the organic layer including the light emitting layer of the OLED manufactured thereby.

Also, by annealing the transferred organic layer regardless of the atmosphere of the pattering process, gases remaining on the transferred organic layer are removed, and by controlling a partial pressure of oxygen and water vapor during the annealing process, a characteristic of the organic layer can be more improved.

Further, by performing the whole process of the patterning and the annealing at inert atmosphere and controlling a partial pressure of oxygen and water vapor, a life span characteristic of the organic layer can be more improved.

Therefore, a life span characteristic of the OLED can be more improved.

What is claimed is:

1. A laser induced thermal imaging method, comprising:
preparing a donor element and a substrate;
facing a transfer layer of the donor element to the substrate and then patterning the transfer layer onto the substrate; and
annealing the patterned substrate, wherein the annealing process is performed in an inert gas atmosphere,
wherein the annealing process at the inert gas atmosphere is performed after controlling water vapor density in the inert gas to be more than 0 ppm and less than 10 ppm, and
wherein annealing the patterned substrate is performed before forming a layer on the patterned transfer layer.

2. The method of claim 1, wherein the transfer layer is a monomer organic layer.

3. The method of claim 1, wherein the donor element is a framed one.

4. The method of claim 1, further comprising, laminating the donor element and the substrate before patterning the transfer layer.

5. The method of claim 1, wherein the transfer layer is a light emitting layer of an OLED.

6. The method of claim 1, wherein the annealing process at the inert gas atmosphere is performed after controlling oxygen density in the inert gas to less than 50 ppm.

7. The method of claim 1, wherein the annealing process at the inert gas atmosphere is performed in a range of a temperature of less than a glass transition temperature of the transfer layer.

8. A laser induced thermal imaging method, comprising:
preparing a donor element and a substrate;
facing a transfer layer of the donor element to the substrate and then patterning the transfer layer onto the substrate; and annealing the patterned substrate at an inert gas atmosphere, wherein the annealing process at the inert gas atmosphere is performed after controlling oxygen density in the inert gas to be more than 0 ppm and less than 50 ppm, and wherein annealing the patterned substrate is performed before forming a layer on the patterned transfer layer.

9. The method of claim 8, wherein the annealing process at the inert gas atmosphere is performed after controlling water vapor density in the inert gas to be less than 10 ppm.

10. The method of claim 8, wherein the annealing process at the inert gas atmosphere is performed in a range of a temperature of less than a glass transition temperature of the transfer layer.

11. The method of claim 8, wherein the donor element is a framed one.

12. The method of claim 8, further comprising, laminating the donor element and the substrate before patterning the transfer layer.

13. The method of claim 8, wherein the transfer layer is a light emitting layer of an OLED.

14. A laser induced thermal imaging method, comprising:
preparing a donor element and a substrate;
facing a transfer layer of the donor element to the substrate and then patterning the transfer layer onto the substrate, at an inert gas atmosphere; and
annealing the patterned substrate at an inert gas atmosphere,
wherein the annealing process at the inert gas atmosphere is performed after controlling water vapor density in the inert gas to be more than 0 ppm and less than 10 ppm, and
wherein annealing the patterned substrate is performed before forming a layer on the patterned transfer layer.

15. The method of claim 14, wherein the annealing process at the inert gas atmosphere is performed after controlling oxygen density in the inert gas to less than 50 ppm.

16. The method of claim 14, wherein the annealing process at the inert gas atmosphere is performed in a range of a temperature of less than a glass transition temperature of the transfer layer.

17. The method of claim 14, wherein the donor element is a framed one.

18. The method of claim 14, further comprising, laminating the donor element and the substrate before patterning the transfer layer.

19. The method of claim 14, wherein the transfer layer is a light emitting layer of an OLED.

20. The method of claim 19, wherein the transfer layer includes one or more selected from a group comprised of a hole injecting layer, a hole transporting layer, a hole blocking layer, and an electron injecting layer.

21. A method of fabricating an organic light emitting display, comprising:
forming a transfer layer on a donor element;
forming arrays having thin film transistors, capacitors and lines on a substrate;
forming pixel electrodes connected to each of thin film transistors;
patterning the transfer layer on the substrate after laminating the donor element and the substrate;
annealing the patterned transfer layer; and
forming an opposite electrode on the annealed transfer layer, wherein the annealing process is performed in an inert gas atmosphere,
wherein the annealing process at the inert gas atmosphere is performed after controlling water vapor density in the inert gas to be more than 0 ppm and less than 10 ppm, or
wherein the annealing process at the inert gas atmosphere is performed after controlling oxygen density in the inert gas to be more than 0 ppm and less than 50 ppm.

22. The method of claim 21, wherein the patterning process is performed at an inert gas atmosphere.

23. The method of claim 21, wherein the annealing process at the inert gas atmosphere is performed in a range of a temperature of less than a glass transition temperature of the transfer layer.

* * * * *